United States Patent [19]

Chan

[11] Patent Number: 5,293,065
[45] Date of Patent: Mar. 8, 1994

[54] LEAD FRAME HAVING AN OUTLET WITH A LARGER CROSS SECTIONAL AREA THAN THE INLET

[75] Inventor: Min Y. Chan, Singapore, Singapore
[73] Assignee: Texas Instruments, Incorporated, Dallas, Tex.
[21] Appl. No.: 936,159
[22] Filed: Aug. 27, 1992
[51] Int. Cl.⁵ ............... H01L 23/48; H01L 29/44; H01L 29/52; H01L 29/60
[52] U.S. Cl. ................... 257/667; 257/666; 257/787
[58] Field of Search ............ 257/666, 667, 787, 692, 257/734, 788, 789, 798

[56] References Cited

U.S. PATENT DOCUMENTS

| 4,862,245 | 8/1989 | Pashby et al. | |
|---|---|---|---|
| 4,894,704 | 1/1990 | Endo | 257/667 |
| 4,916,519 | 4/1990 | Ward | |
| 4,965,654 | 10/1990 | Karner et al. | |

FOREIGN PATENT DOCUMENTS

| 54-152970 | 12/1979 | Japan | 257/667 |
|---|---|---|---|
| 59-23554 | 2/1984 | Japan | 257/667 |
| 60-59759 | 4/1985 | Japan | 257/667 |
| 62-24653 | 2/1987 | Japan | 257/667 |
| 63-265454 | 11/1988 | Japan | 257/667 |
| 1-65861 | 3/1989 | Japan | 257/667 |
| 1-276657 | 11/1989 | Japan | 257/667 |
| 1-278055 | 11/1989 | Japan | 257/667 |
| 63-150846 | 12/1989 | Japan | 257/667 |
| 3-280562 | 12/1991 | Japan | 257/667 |
| 4-184966 | 7/1992 | Japan | 257/667 |

OTHER PUBLICATIONS

William C. Ward, "Volume Production of Unique Plastic Surface-Mount Modules for the IBM 80-ns 1-Mblr Dram Chip by Area Wire Bond Techniques", 1988 IEEE, pp. 552-557.

Primary Examiner—Andrew J. James
Assistant Examiner—Carl Whitehead, Jr.
Attorney, Agent, or Firm—Robby T. Holland; Richard B. Havill; Lawrence J. Bassuk

[57] ABSTRACT

A lead frame (10) is connected to an integrated circuit (32) by adhesives. The lead frame (10) includes a mold gate (40) to provide for constant flow of resin (72) into the mold cavity (66) during encapsulation of the integrated circuit (32). The lead frame (10) also has an air vent (50) to direct air and any excess resin (74) from the mold cavity (66) to a dummy cavity (70).

5 Claims, 2 Drawing Sheets

LEAD FRAME HAVING AN OUTLET WITH A LARGER CROSS SECTIONAL AREA THAN THE INLET

TECHNICAL FIELD OF THE INVENTION

This invention relates to integrated circuits, and more particularly relates to a lead frame having slots for use while molding an integrated circuit and its associated electrical leads into a finished product.

BACKGROUND OF THE INVENTION

Various techniques have previously been used to package integrated circuits using transfer molding equipment and procedures. Also, various lead frame designs have been used with integrated circuits, such as the flip chip design, the small outline J-lead (SOJ) packaging, and the lead-on-chip (LOC) packaging. These techniques include attaching an integrated circuit to a lead frame and wire bonds connecting the integrated circuit to conductive leads on the lead frame. The integrated circuit and lead frame are then placed into a mold and resin or thermoplastic molding compound injected into the mold cavity. Electrical components of the integrated circuit including portions of the conductive leads are encapsulated in resin or molding compound. The encapsulated package is cured, deflashed and external conductive leads prepared (trimmed, formed, coated, etc.) as required for the specific integrated circuit design. The finished product is an integrated circuit which has been encapsulated in a plastic body with electrically conductive leads extending from the plastic body. The objective of the molding process is to obtain plastic encapsulation which totally surrounds the integrated circuit and associated components with no void spaces or defects in the encapsulation.

While prior molding techniques have worked satisfactorily in packaging many integrated circuits, the advent of more complex and smaller scale integrated circuit designs has increased the importance of obtaining plastic encapsulation without any void spaces, air pockets, or other defects in the finished integrated circuit package. Incomplete filling of the mold cavity with resin or void spaces within the encapsulation will result in a defective product.

Conventional transfer molding techniques use a mold with two sections or halves that are secured to opposite sides of the integrated circuit and its associated lead frame. The mold halves are securely clamped together (sandwiched) about the integrated circuit and lead frame. Conventional molds have an opening (mold flow gate) in either the top half of the mold or the bottom half of the mold for injection of the molding compound. A portion of the mold opposite the injection point (flow gate) usually has one or more small air vents to allow air and other gases to escape from the mold cavity as the resin is injected. The pressure drop which occurs at the mold flow gate and resin flow therethrough frequently cause erosion and wear at the injection opening in the mold. Erosion of the injection opening (bottom gate or top gate) limits the useful life of the mold.

The small openings used for air vents in conventional molds frequently become plugged. Plugging of the air vents will either reduce the life of the mold or require increased maintenance to open any plugged air vents. As integrated circuits are reduced in size (become thinner), more air or other gases must be displaced from the cavity of existing molds which increases the opportunity for plugging. Designing new molds for each new change in dimensions of an integrated circuit is very expensive and time consuming.

A need has arisen for a lead frame with slots to improve resin fluid flow during the molding process, to provide uniform encapsulation of an integrated circuit package and to improve the useful life of the mold.

SUMMARY OF THE INVENTION

In accordance with the present invention, disadvantages and problems associated with previous transfer molding techniques for integrated circuit packages have been substantially reduced or eliminated by using the present packaging invention. An integrated circuit and its associated lead frame are positioned within a mold cavity. Molding compound is injected into the mold cavity to encapsulate the integrated circuit and portions of the conductive leads extending therefrom to form an encapsulated package.

In accordance with one aspect of the invention, a lead frame with an integrated circuit attached thereto is positioned between two halves of a mold. The lead frame supports the integrated circuit and its associated components within the mold cavity. One opening or slot within the lead frame allows resin or molding compound to be injected into the mold cavity, and a second opening or slot allows air and excess resin to escape from the mold cavity. The first opening is positioned opposite from the second opening in the lead frame.

The present invention has significant technical advantages in that a lead frame is provided for integrated circuits which includes a mold gate or resin flow slot which results in constant flow of resin into the mold cavity during the encapsulation process. The mold gate in the lead frame provides increased service life for the mold. Any erosion or wear during the molding process occurs at the mold gate on the lead frame rather than at an opening in the mold (top gate or bottom gate).

The present invention has another significant technical advantage in that a lead frame is provided for integrated circuits which includes an air vent or slot in the lead frame to allow any air, other gases or excess resin in the mold cavity to escape. The air vent slot in the lead frame allows satisfactory use of a mold cavity with integrated circuits of varying sizes (thickness) and improves the service life of the mold while reducing maintenance requirements.

In accordance with another aspect of the invention, a dummy cavity is provided in the mold to allow air, other gases and excess resin to escape from the mold cavity during encapsulation of the integrated circuit and portions of conductive electrical leads extending from the integrated circuit.

A significant technical advantage of the present invention is that the dummy cavity provides a reservoir for excess molding compound injected into the mold cavity. Proper filling of the dummy cavity with excess molding compound provides an indication that the mold cavity has itself been properly filled during the injection phase of the molding process.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
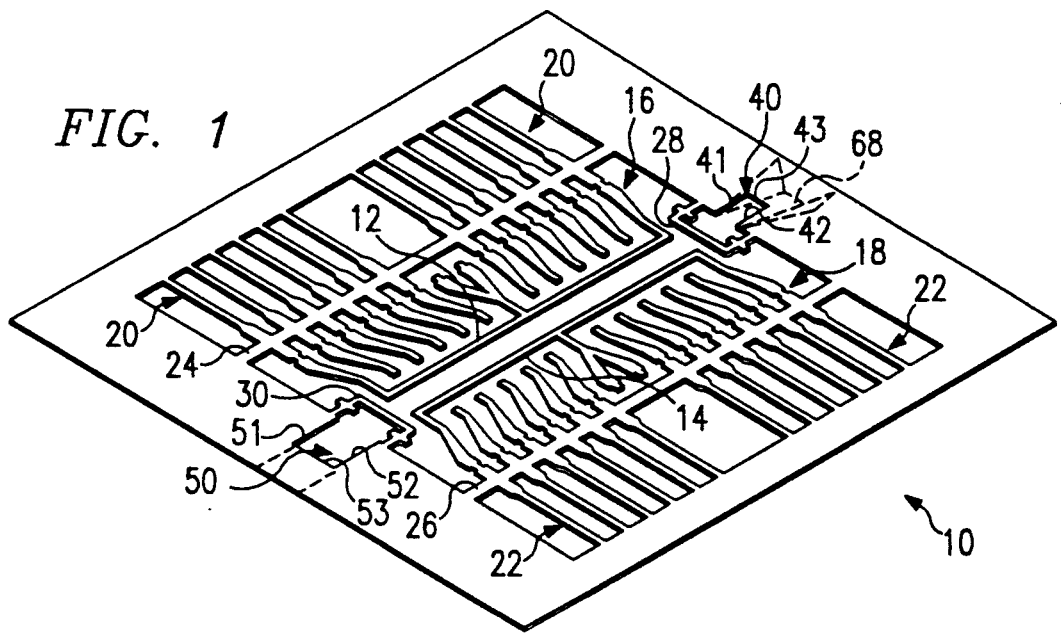
FIG. 1 is an isometric drawing of a lead frame incorporating the present invention.

Referring to FIG. 1, lead frame 10 of the present invention comprises metal sheet which may be formed from various metal alloys, such as full hard temper CDA alloy 151 having an approximate thickness of 0.008 inches and may be spot plated with gold, silver or other metals. Lead frame 10 has a plurality of cut-outs stamped therein to define the electrical lead configuration for the desired integrated circuit. Specifically, the lead configuration comprises a pair of power buses 12 and 14 with elongated parallel conductive leads suitable for receiving electrical power. A first group of conductive leads 16 is exposed generally normal to power bus 12 with leads 16 being arranged in a side by side relationship. A second group of conductive leads 18 is disposed generally normal to power bus 14 with leads 18 arranged in a side by side relationship. Different numbers of conductive leads 16 and 18 may be provided in lead frame 10 as required depending upon the design of the specific integrated circuit which will be attached thereto.

Conductive leads 16 and 18 are used to provide input and output signals to integrated circuit 32. Cutouts in lead frame 10 also define a first group of lead extensions 20 and a second group of lead extensions 22. Support bars 24 and 26 respectively are provided in lead frame 10 to serve as a transition between leads 16 and lead extensions 20 and leads 18 and lead extensions 22. Following encapsulation of the integrated circuit, support bars 24 and 26 are cut away or trimmed along with lead extensions 20 and 22 during the final assembly of the encapsulated package. Support bars 28 and 30 are also provided on opposite ends of lead frame 10 to provide additional support for the encapsulated package which surrounds leads 16, 18 and integrated circuit 32.

An important aspect of the present invention is the provision of slot or opening 40 in lead frame 10 at the end having support bar 28. Slot or opening 40 in lead frame 10 has the general configuration of a rectangle with sides 41, 42 and 43. As will be discussed later in more detail, slot 40 functions as a flow gate to control the flow of resin or molding compound into mold cavity 66.

Another important aspect of the invention is the provision of slot or opening 50 in lead frame 10 opposite from slot 40. Slot 50 has the general configuration of a rectangle with sides 51, 52 and 53. Slot 50 functions as a vent to allow air or other gases to escape from mold cavity 66. Also, slot 50 allows any excess resin within mold cavity 66 to escape to dummy cavity 70 which will be described later in more detail. The cross-sectional flow area of slot 50 is preferably larger than the cross-sectional flow area of slot 40.

Figure 2:
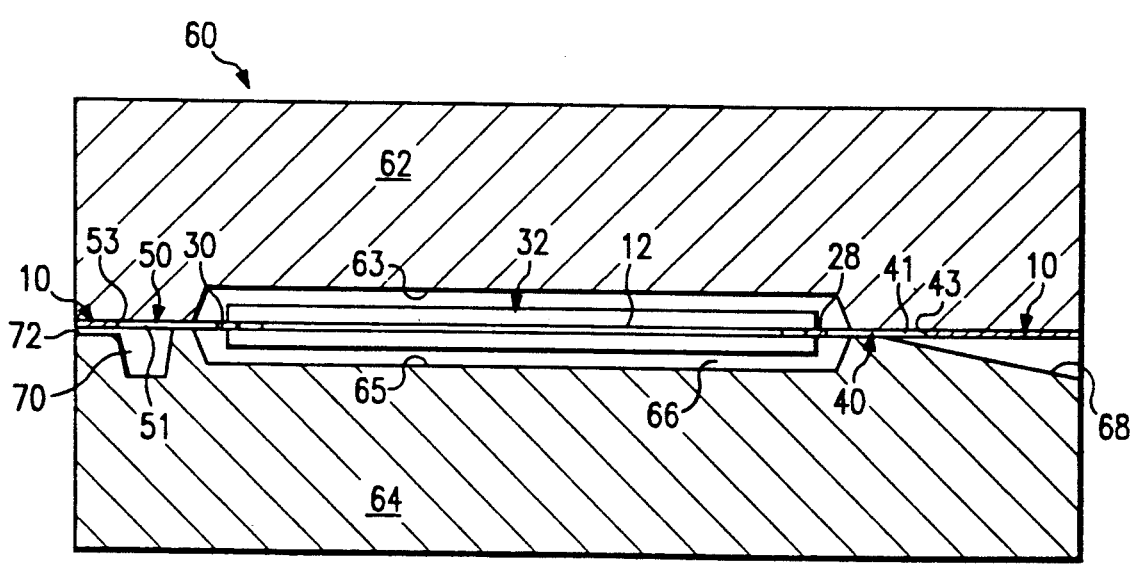
FIG. 2 is a drawing in section showing the lead frame of FIG. 1 with an integrated circuit attached thereto and disposed within a mold cavity.

As best shown in FIG. 2, lead frame 10 and attached integrated circuit 32 are disposed within mold 60 in preparation for encapsulation with a suitable resin or thermoplastic molding compound. Novolac epoxy compound has been found to be a satisfactory resin for use in encapsulating integrated circuits. Mold 60 comprises an upper mold half 62 and a lower mold half 64 with a mold chase 63 and 65 formed respectfully in each half of mold 60. Mold chase 63 and mold chase 65 cooperate to define mold cavity 66 when mold halves or sections 62 and 64 are clamped together. Integrated circuit 32 and portions of lead frame 10 with conductive lead 16 and 18 are positioned with mold cavity 66. Lead frame 10 defines the part line for mold 60 when the encapsulation process has been completed.

Lower mold half 64 has an opening 68 in one end which is positioned to communicate with slot 40. Opening 68 has the general configuration of a frustum. Opening 68 functions as a funnel to direct the flow of molding compound from an exterior source (not shown) to slot 40. The configuration of opening 68 cooperates with slot 40 to produce a constant flow rate as resin or molding compound is injected into cavity 66. When lead frame 10 is sandwiched between upper half 62 and lower half 64, slot 40 provides an opening or flow gate for the injection of molding compound into cavity 66. As resin is injected into cavity 66, any air or other gases trapped therein can exit through slot 50.

Since lead frame 10 is removed from mold 60 after completion of the encapsulation process, slot 40 is not subject to erosion and wear from repeated use. Therefore, each time a new lead frame 10 and integrated circuit 32 are placed within mold 60, a new slot 40 with consistent, uniform dimensions is used to control the flow of molding compound into cavity 66. Lead frame 10 with slot 40 insures consistent molding compound flow into cavity 66 during repeated encapsulation of integrated circuits.

Another important feature of the present invention is the provision of dummy cavity 70 in lower mold half 64. Dummy cavity 70 is positioned with respect to lead frame 10 and air vent or slot 50 to receive air and any excess molding compound exiting from cavity 66. If desired, the resin injecting system (not shown) may be designed to inject a small amount of excess molding compound into cavity 66. This planned amount of excess molding compound is then trapped in dummy cavity 70 and provides a good indication that cavity 66 has been properly filled. If dummy cavity 70 does not contain the desired amount of excess molding compound, it is an indication that cavity 66 was also not filled with the required amount of molding compound.

As best shown in FIG. 2, dummy cavity 70 has the cross-section of a trapezoid. The volume of dummy cavity 70 is substantially less than the volume of mold cavity 66.

Lead frame 10 and integrated circuit 32 are preferably positioned within mold 60 and cavity 66 as shown in FIG. 2. This arrangement provides a flow path for resin from opening 68 of lower mold half 64 through slot 40 into cavity 66 exiting via slot 50 into dummy cavity 70. A small gap 72 may be provided in lower mold half 64 to allow air to escape from dummy cavity 70 as excess molding compound fills dummy cavity 70.

Figure 3:
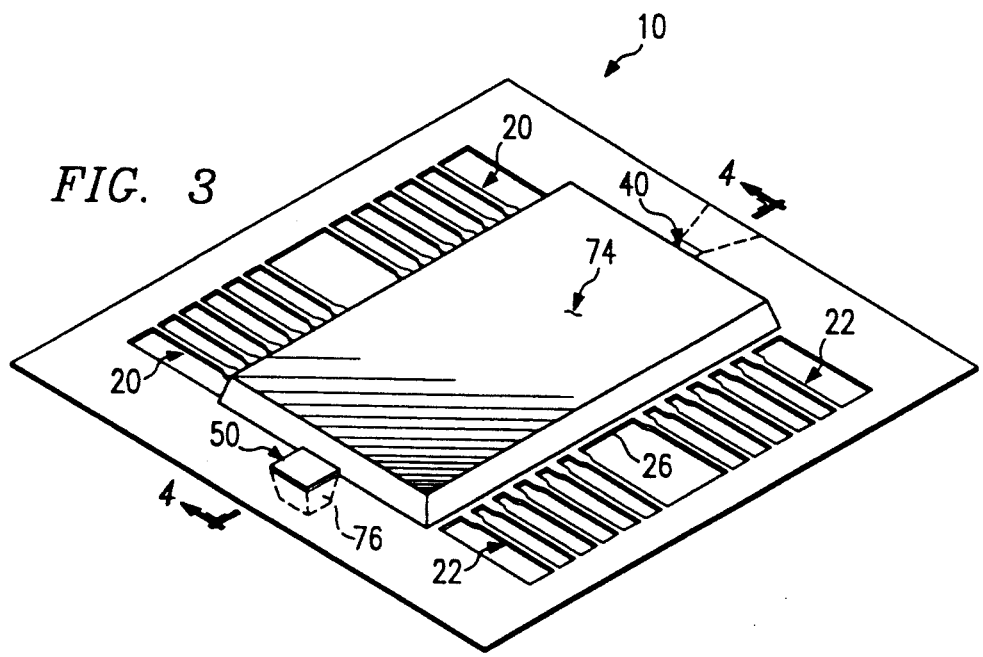
FIG. 3 is an isometric drawing showing the lead frame and encapsulated integrated circuit after being removed from the mold of FIG. 2.

Thermoplastic resin or molding compound is heated to a desired temperature which will liquify the molding compound to allow injection at a preselected pressure and temperature into cavity 66. The injection pressure and temperature vary with the type of molding compound and with the characteristics of the integrated circuit and its associated components. After the injection process has been completed and the resin compound allowed to solidify, mold halves 62 and 64 are opened and lead frame 10 with encapsulated integrated circuit 32 as shown in FIG. 3 is removed. The molding compound has now solidified to produce encapsulation or plastic body 74 which surrounds integrated circuit 32 and portions of conductive leads 16 and 18. External conductive leads 20 and 22 extend from encapsulation 74. At a later stage in the process, supporting bars 24 and 26 will be trimmed from plastic body 74.

Figure 4:
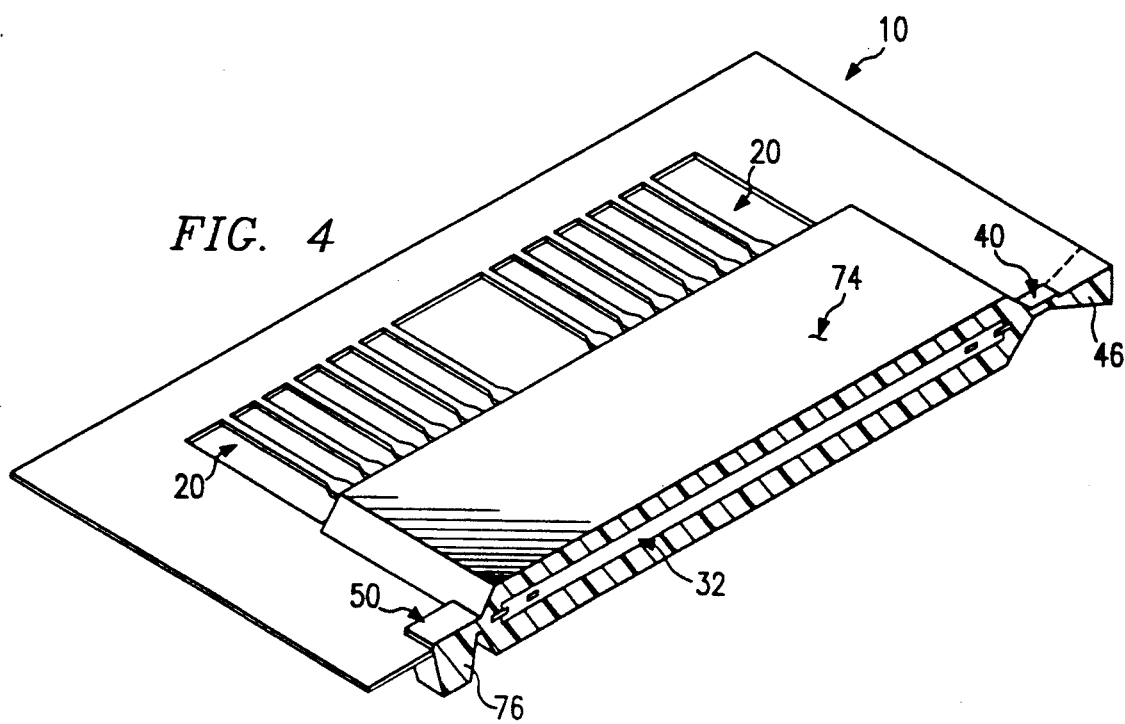
FIG. 4 is an isometric drawing in section taken along lines 4—4 of FIG. 3.

The benefits and technical advantages of the present invention are best shown in FIG. 4. When the resin compound hardens, the resulting encapsulation 74 matches the internal configuration of opening 68, mold cavity 66 and dummy cavity 70. Any excess resin 76 which might have blocked the air vents in prior mol designs is removed with lead frame 10. This excess resin has the general configuration of dummy cavity 70. In the same manner, resin in the flow gate portion of mold 60 is removed with lead frame 40 and has the configuration of opening 68 and flow gate 40. This material is designated 46 in FIG. 4. An important improvement of the present invention is the removal of excess molding compound 76 and 46 with lead frame 10. Therefore, maintenance requirements for lower mold half 64 are significantly reduced and the effective life of mold 60 is substantially increased.

Those skilled in the art will readily note that the configuration of slot 40, opening 68, slot 50 and dummy cavity 70 may be varied to meet specific operating requirements of the injection molding system. For certain types of molding compounds, opening 68 and dummy cavity 70 may have the general cross-section of a cone or funnel. Both slots or openings 40 and 50 may be formed with alternative configurations including but not limited to a square, semi-circle or portion of an ellipse. The present invention allows modifying slots 40 and 50 for optimum flow of molding compound into cavity 66.

The present invention is not limited to use with only lead frame 10 having power buses 12 and 14. Many lead frames use a die pad or bar pad to mount an integrated circuit on the lead frame. Slot 40 (flow gate) and slot 50 (air vent) may be used with a wide variety of lead frame designs.

Although the present invention has been described in detail, it should be understood that various changes, substitutions and alterations can be made herein without departing from the spirit and the scope of the invention as defined by the following claims.

What is claimed is:

1. A lead frame for an integrated electrical circuit comprising:
    a plurality of elongated conductive leads extending in side by side relationship for attachment with the integrated electrical circuit;
    an opening, including a first slot through one portion of the lead frame, for injecting molding compound through the lead frame after the lead frame and attached integrated electrical circuit have been positioned in a mold cavity; and
    an opening, including a second slot through a portion of the lead frame opposite from the first slot, for air to escape from the mold cavity during injection of resin into the cavity, the second slot has a larger cross-sectional flow area as compared to the cross-sectional flow area of the first slot.

2. The lead frame of claim 1 wherein the opening for air to escape from the mold cavity further comprises a slot in one portion of the lead frame to allow fluid communication from the mold cavity into a dummy cavity.

3. A lead frame for an integrated electrical circuit comprising:
    a plurality of elongated conductive leads extending in side by side relationship for attachment with the integrated electrical circuit;
    an opening, including a first slot through one portion of the lead frame, for injecting molding compound through the lead frame when the lead frame and attached integrated electrical circuit have been positioned in the mold cavity; and
    an opening, including a second slot through a portion of the lead frame opposite from the first slot, for air to escape through the lead frame when the lead frame and attached integrated electrical circuit have been positioned in a mold cavity, the second slot has a larger cross-sectional flow area as compared to the cross-sectional flow area of the first slot.

4. The lead frame of claim 3 wherein the opening for air to escape further comprises a slot in one portion of the lead frame to allow fluid communication from the mold cavity to a dummy cavity while molding compound is injected into the mold cavity through a mold gate.

5. The lead frame of claim 4 wherein the slot for air to escape further comprises a larger flow area than the flow area of the mold gate.

* * * * *